(12) United States Patent
Fazil et al.

(10) Patent No.: US 12,721,129 B2
(45) Date of Patent: Aug. 25, 2026

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Damir Fazil, Boise, ID (US); Indra V. Chary, Boise, ID (US); Nancy M. Lomeli, Boise, ID (US); Rajasekhar Venigalla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 943 days.

(21) Appl. No.: 17/582,280

(22) Filed: Jan. 24, 2022

(65) Prior Publication Data

US 2023/0207469 A1 Jun. 29, 2023

Related U.S. Application Data

(60) Provisional application No. 63/294,009, filed on Dec. 27, 2021.

(51) Int. Cl.
*H10W 20/20* (2026.01)
*H10B 41/27* (2023.01)
*H10B 43/27* (2023.01)

(52) U.S. Cl.
CPC ............ *H10W 20/20* (2026.01); *H10B 41/27* (2023.02); *H10B 43/27* (2023.02)

(58) Field of Classification Search
CPC ....... H01L 23/535; H10B 41/27; H10B 43/27; H10B 41/40; H10B 41/50; H10B 43/40; H10B 43/50
See application file for complete search history.

(56) References Cited

U.S. PATENT DOCUMENTS 10,354,987 B1 7/2019 Mushiga et al.
12,176,034 B2 * 12/2024 Scarbrough ............ H10B 41/27
(Continued)

FOREIGN PATENT DOCUMENTS

CN 113629058 11/2021
KR 20150138139 A * 12/2015 ........ H01L 27/11551

OTHER PUBLICATIONS

Machine Translation of KR 20150138139A (Year: 2015).*
U.S. Appl. No. 17/537,990, filed Nov. 30, 2021, by Lomeli et al.

*Primary Examiner* — Jacob Y Choi
*Assistant Examiner* — Aaron Michael Wegner
(74) *Attorney, Agent, or Firm* — Wells St. John P.S.

(57) ABSTRACT

A memory array comprising strings of memory cells comprise laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAV constructions that individually extend through the insulative tiers and the conductive tiers into the conductor tier. Individual of the TAV constructions comprise an upper portion directly above and joined with a lower portion. The individual TAV constructions comprise at least one external jog surface in a vertical cross-section where the upper and lower portions join. Other embodiments, including method, are disclosed.

16 Claims, 17 Drawing Sheets

(56) References Cited

U.S. PATENT DOCUMENTS

2015/0179704 A1 6/2015 Yoshida et al.
2016/0351581 A1 12/2016 Ahn
2017/0179026 A1* 6/2017 Toyama ............ H01L 21/76802
2020/0161325 A1* 5/2020 Clampitt ................ H10B 43/10
2020/0295026 A1 9/2020 Oike
2021/0217761 A1 7/2021 Tiwari
2021/0288067 A1 9/2021 Kanamori et al.
2021/0313343 A1* 10/2021 Jung ...................... H10B 43/35
2021/0313427 A1 10/2021 Kim et al.
2021/0351128 A1 11/2021 Kim et al.
2021/0358943 A1* 11/2021 Lee ........................ H10B 41/27
2021/0375911 A1* 12/2021 Greenlee ............. H01L 21/0217
2022/0336421 A1* 10/2022 Kim ........................ H01L 25/18
2023/0074982 A1* 3/2023 He .................... H01L 21/76885

* cited by examiner 10
19
3
55
85
80
43
58
12
3

2
20w
21
20x
22z
20z
16
18L
17
11
87
24
47
63
77
62
44

10
19
55
5
85
86
80
78
58
43
12

4
20w
21
20x
22z
20z
16
18L
17
11
87
24
47
63
77
62
44

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-33 which may be considered as "gate-last" or "replacement-gate" processing. Further, and regardless, the following sequence of processing steps is but one example and other sequences of the example processing steps (with or without other processing steps) may be used regardless of whether using "gate-last/replacement-gate" processing.

Figure 1:
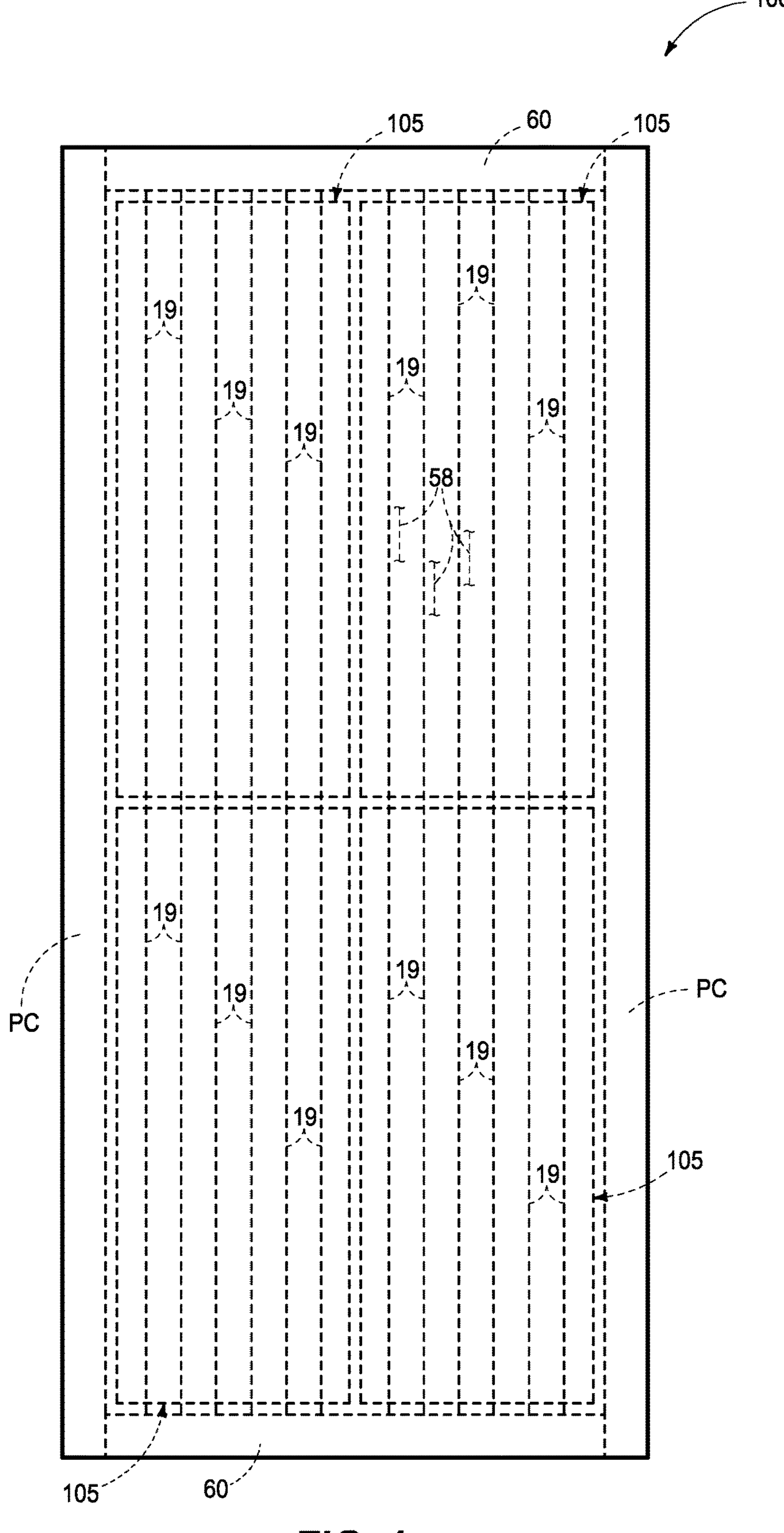
FIG. 1 is a diagrammatic top plan view of a die or die area that may be part of a larger substrate (e.g., a semiconductor wafer, and not shown).
Figures 2, 3:
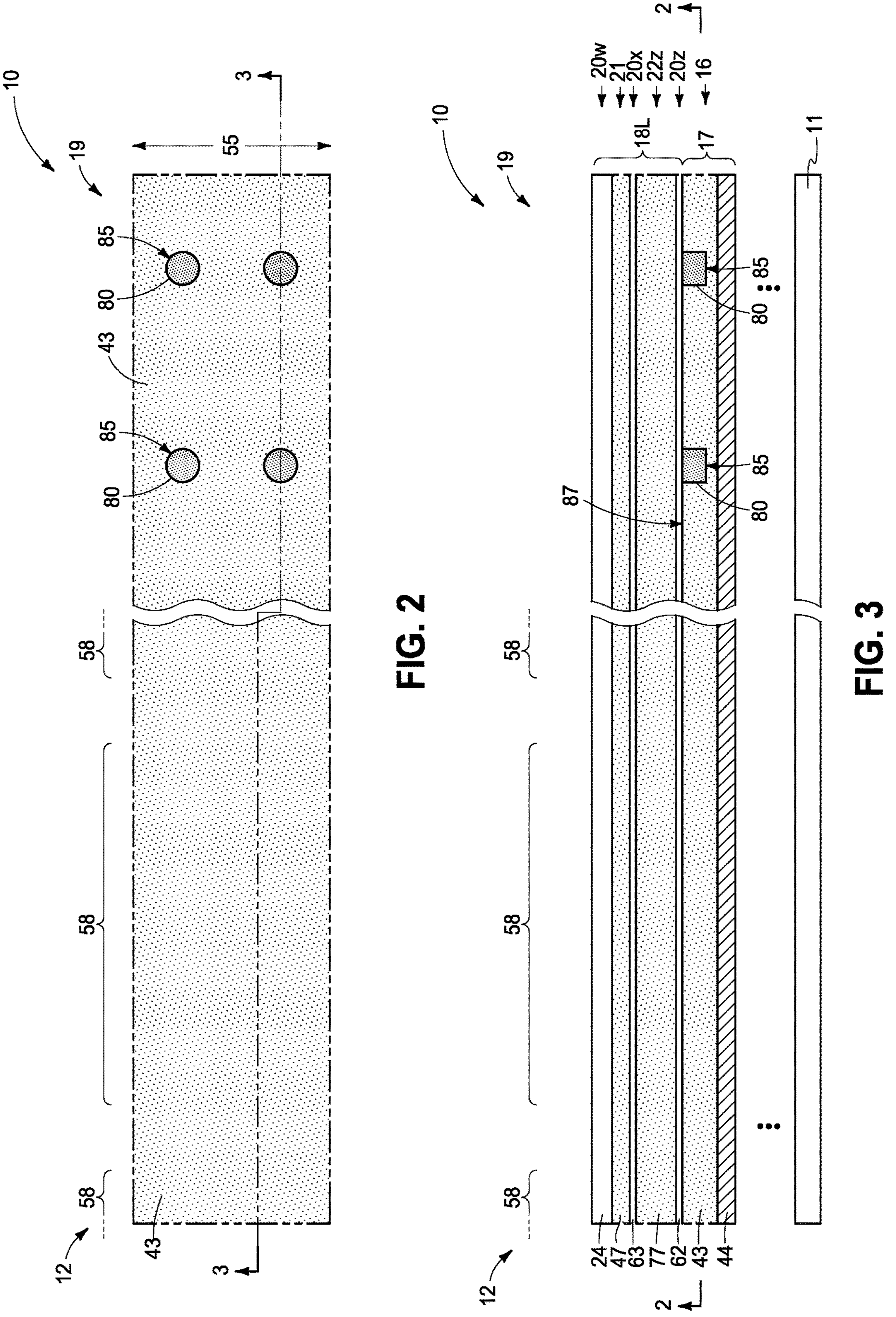
FIGS. 2 and 3 are diagrammatic cross-sectional views of portions of a construction (e.g., as part of FIG. 1) that will comprise an array of elevationally extending strings of memory cells in accordance with an embodiment of the invention.

FIG. 1 shows an example diagrammatic embodiment comprising a die or die area 100 that may be part of a larger substrate (e.g., a semiconductor wafer, and not shown) and in which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, and/or PC may not be discernable at this point of processing. FIGS. 2 and 3 are diagrammatic larger scale views of portions of die area 100.

Referring to FIGS. 2 and 3, a construction 10 is shown in a method of forming an array or array region 12 of elevationally-extending strings of transistors and/or memory cells (not yet fabricated) and in forming a through-array-via (TAV) region 19. A "TAY region" is a region in which operative TAVs are present or will be formed. An "operative TAV" is a circuit-operative conductive interconnect extending through a stack and between electronic components at different elevations in a finished construction of integrated circuitry that has been or is being fabricated (e.g., through a stack 18* described below; an * being used as a suffix to be inclusive of all such same-numerically-designated components that may or may not have other suffixes). A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be in a memory-block region (not shown).

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2 and 3-depicted materials. For example, other partially or wholly fabricated components of integrated circuitry may be provided somewhere above, about, or in base substrate 11. Control and/or other peripheral circuitry for operating components in an array (e.g., array 12 or memory-array region 12) of elevationally-extending strings of memory cells may also be fabricated and may or may not be wholly or partially in an array or sub-array. Further, multiple sub-arrays may also be fabricated and operated independently, in tandem, or otherwise relative one another. In this document, a "sub-array" may also be considered as an array.

In one embodiment, a conductor tier 16 (e.g., having a top 87) comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises conductive metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed in array 12.

A lower portion 18L of a stack 18* has been formed directly above conductor tier 16 (when present) and substrate 11. Stack 18* will comprise vertically-alternating conductive tiers 22* and insulative tiers 20*. Lower portion 18L and conductor tier 16 collectively comprise laterally-spaced memory-block regions 58 that will comprise laterally-spaced memory blocks 58 in a finished circuitry construction and comprise TAV region 19. Memory-block regions 58 and resultant memory blocks 58 (not yet shown) may be considered as being longitudinally elongated and oriented, for example horizontally-parallel relative one another, along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20*z* of second tiers 20* directly above (e.g., directly against) conductor material 17. Example lowest second tier 20*z* is insulative and may be sacrificial (e.g., in array region 12; e.g., comprising material 62, for example silicon dioxide and/or silicon nitride). A next-lowest second tier 20*x* of second tiers 20* is directly above lowest second tier 20*z* and may be sacrificial (e.g., in array region 12; e.g., comprising material 63, for example silicon dioxide and/or silicon nitride). A lowest tier 22*z* of first tiers 22* comprising sacrificial material 77 (e.g., polysilicon or silicon nitride) is vertically between lowest second tier 20*z* and next-lowest second tier 20*x*. Example lower portion 18L comprises a conducting-material tier 21 comprising conducting material 47 (e.g., conductively-doped polysilicon) that is directly above next-lowest second tier 20*x*. In one embodiment, lower portion 18L comprises an uppermost tier that is a next-next lowest second tier 20*w* (e.g., comprising material 24; e.g., silicon dioxide). Tiers 20*w* and 21 may be of the same or of different thickness(es) relative one another. Additional tiers may be present. For example, one or more additional tiers may be above tier 20*w* (tier 20*w* thereby not being the uppermost tier in portion 18L, and not shown), between tier 20*w* and tier 21 (not shown), and/or below tier 22*z* (other than 20*z* not being shown).

Sacrificial plugs 80 have been formed in conductor tier 16 in TAV region 19 and are individually horizontally-located where individual TAVs (not-yet-shown) will be formed (e.g., where such will at least partially be formed; e.g., in locations 85). In one embodiment, sacrificial plugs 80 are insulative, and in one such embodiment comprise an aluminum oxide (e.g., stoichiometric or non-stoichiometric; e.g., $Al_2O_3$). In one embodiment, sacrificial plugs 80 are conductive and in another embodiment are semiconductive.

Figures 4, 5:
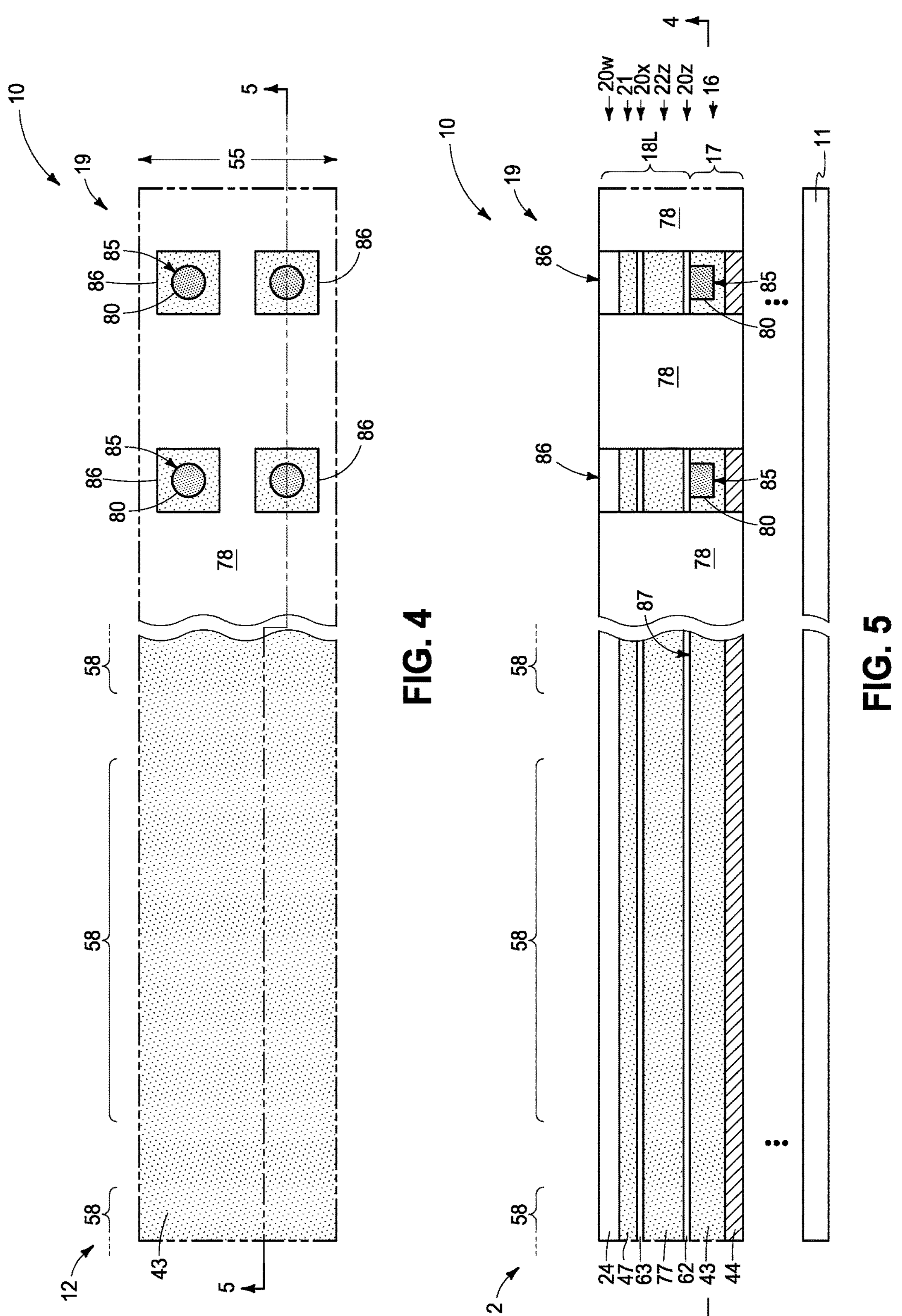
FIGS. 4-33 are diagrammatic sequential sectional and/or enlarged views of the construction of FIGS. 2 and 3, or portions thereof or alternate and/or additional embodiments, in process in accordance with some embodiments of the invention.
Figures 6, 7:
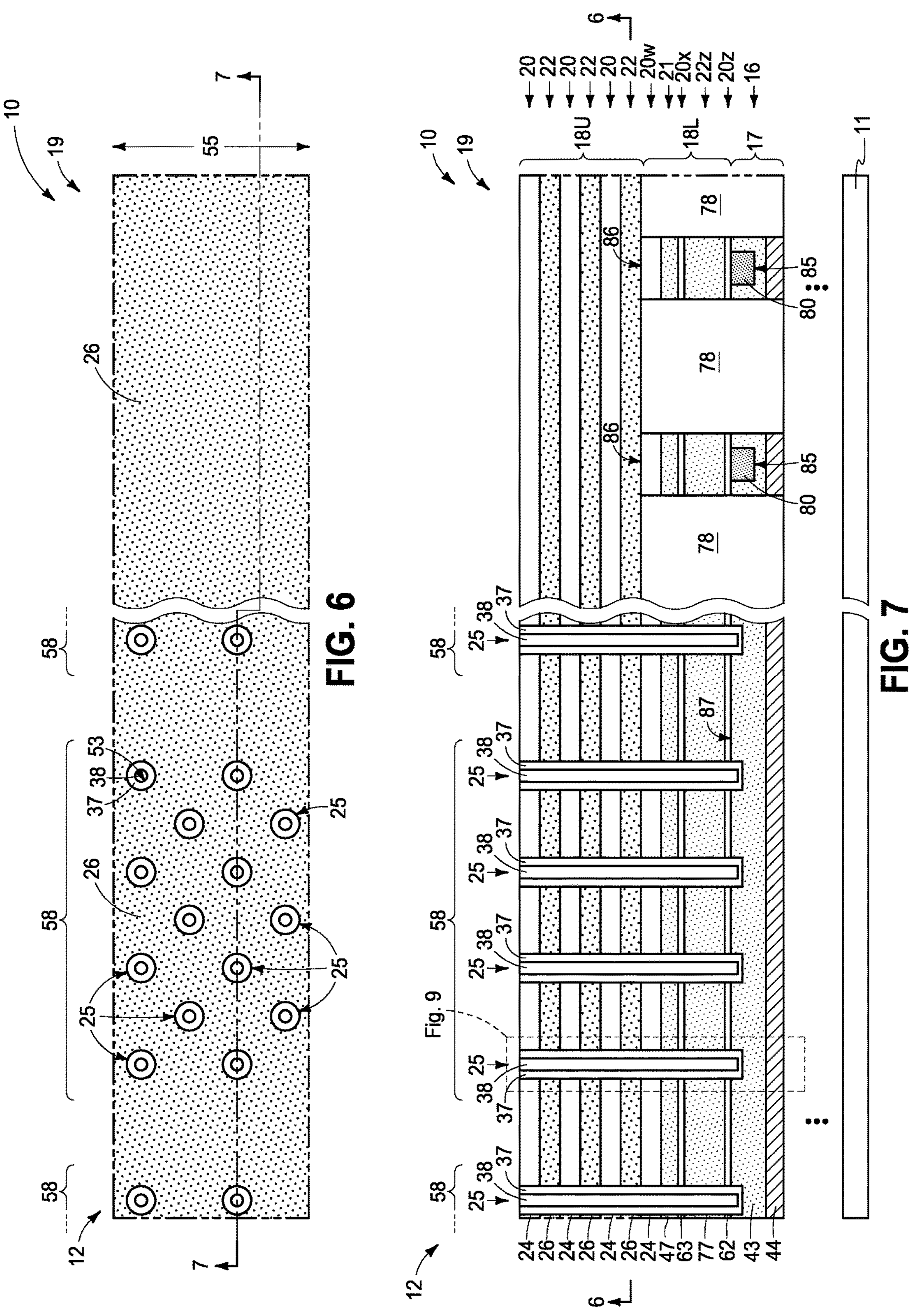
Figure 9:
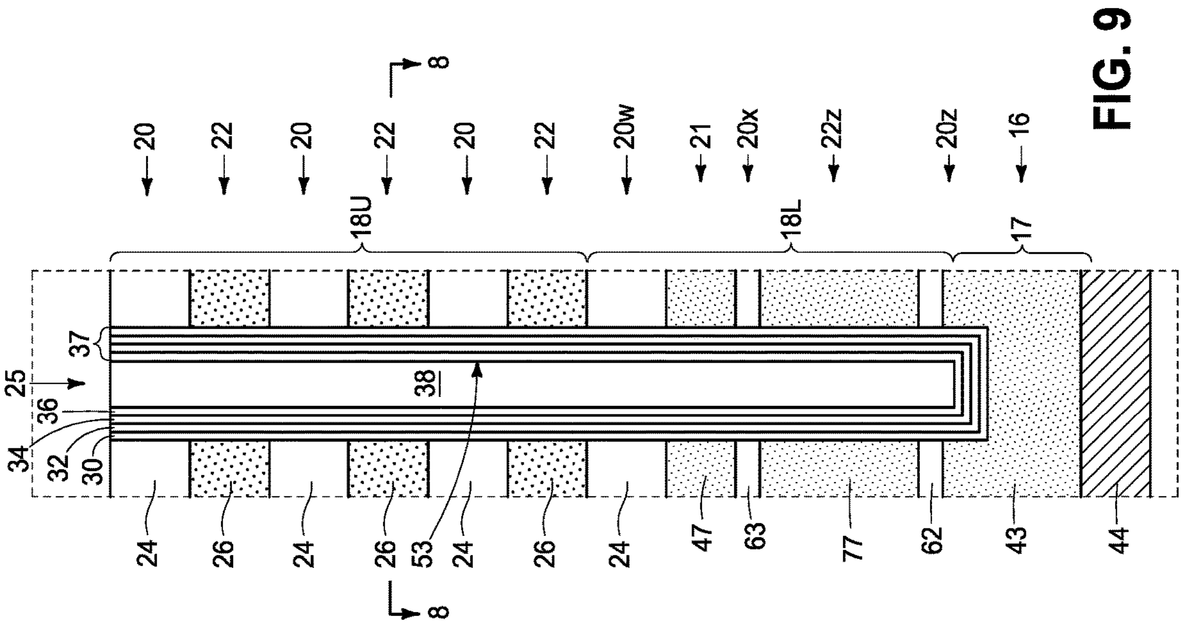
Figure 8:
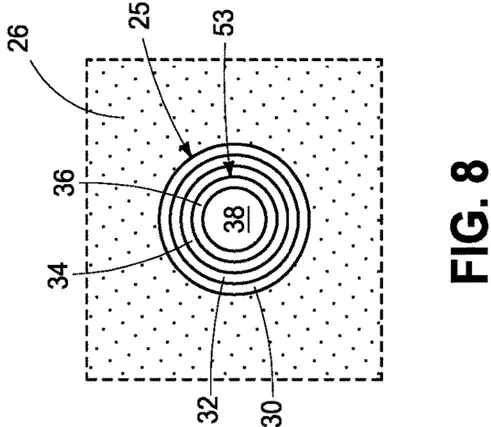

Referring to FIGS. 4 and 5, example tiers 20*w*, 21, 20*x*, 22*z*, 20*z*, and 16 in TAV region 19 have been patterned, for example forming islands 86 comprising materials/plugs 24, 47, 63, 77, 62, 43, 44, and 80. Example islands 86 are shown as being larger than and surrounding original sacrificial plugs 80. Alternately, by way of example, islands 86 may horizontally be of the same size(s) and shape(s) as sacrificial plugs 80 or be smaller than their horizontal size(s) (neither being shown). Regardless, example construction 10 shows insulative material 78 (e.g., silicon dioxide and/or silicon nitride) as having been formed and planarized back at least to remaining outermost tier 20*w* of islands 86. Patterning may also occur (not shown) of tiers 20*w*, 21, 20*x*, 22*z*, 20*z*, and 16 in array region 12.

Referring to FIGS. 6-9, an upper portion 18U of stack 18* has been formed directly above lower portion 18L of stack 18* and sacrificial plugs 80. Example upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a first tier 22 although such could alternately start with a second tier 20 (not shown) or tier 20*w* may be considered as being in upper portion 18U (not so designated). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been formed (e.g., by etching) through second tiers 20 and first tiers 22 in upper portion 18U to conductor tier 16 in lower portion 18L (e.g., at least to lowest first tier 22*z* in lower portion 18L). Channel openings 25 may taper radially-inward (not shown) moving deeper into stack 18*. In some embodiments, channel openings 25 may go into conductor material 17 of conductor tier 16 as shown or may stop there-atop (not shown). Alternately, as an example, channel openings 25 may stop atop or in the lowest second tier 20*z*. A reason for extending channel openings 25 at least to conductor material 17 of conductor tier 16 is to provide an anchoring effect to material that is in channel openings 25. Etch-stop material (not shown) may be in or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and in individual openings 25 followed by planarizing such back at least to a top surface of stack 18*.

Channel material 36 as a channel-material string 53 has also been formed in channel openings 25 elevationally along insulative tiers 20 and conductive tiers 22 in memory-block regions 58. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or in the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown).

Figures 10, 11:
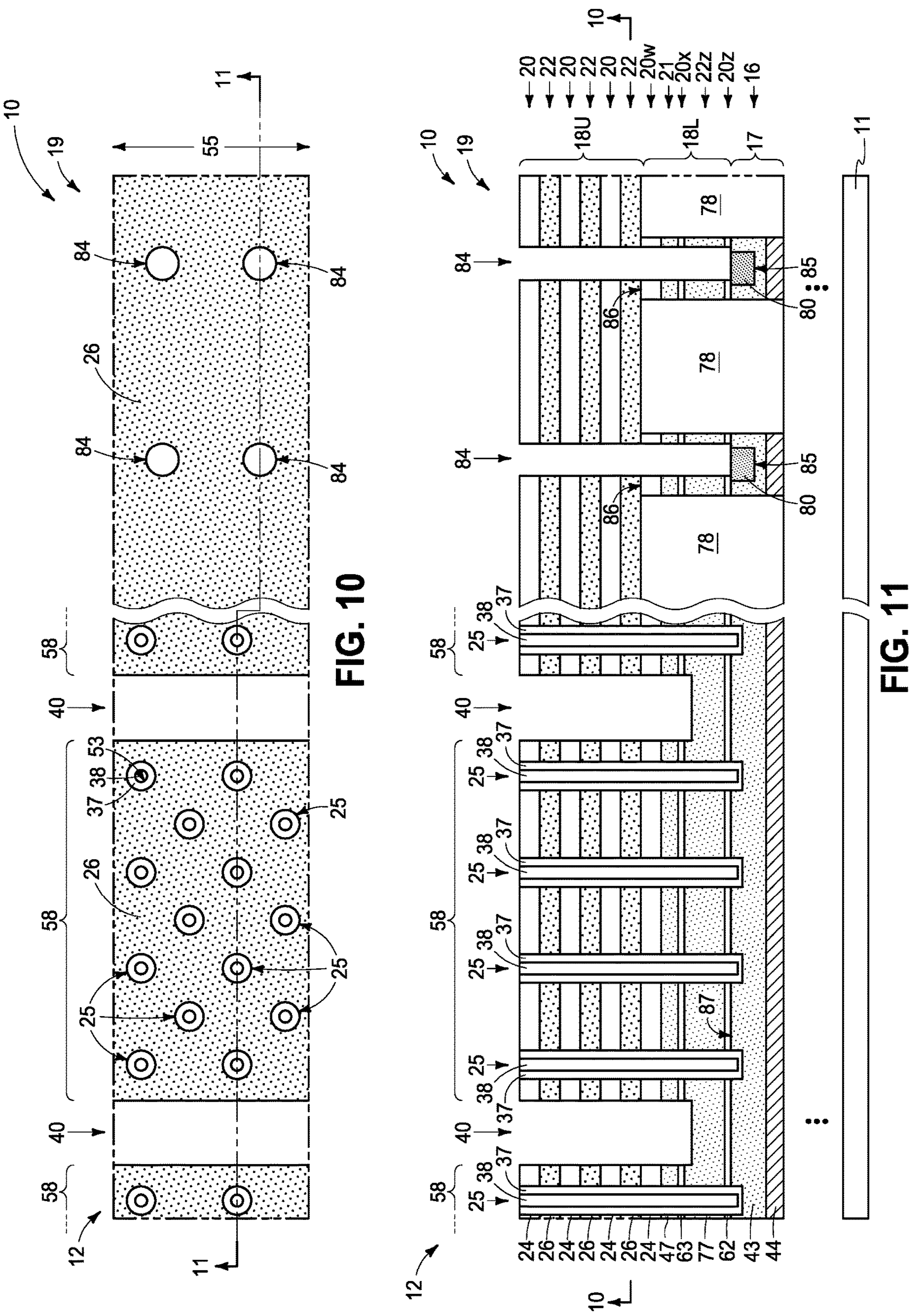

Referring to FIGS. 10 and 11, horizontally-elongated trenches 40 have been formed (e.g., by anisotropic etching) into stack 18* through upper portion 18U to lower portion 18L and that are individually between immediately-laterally-adjacent memory-block regions 58. A sacrificial etch-stop line (not shown) having the same general horizontal outline as trenches 40 may individually be formed below stack 18 prior to forming trenches 40. Trenches 40 may then be formed by etching materials 24 and 26 to stop on or in the material of the individual sacrificial lines, followed by exhuming remaining material of such sacrificial lines. Trenches 40 may taper laterally-inward or laterally-outward moving deeper into stack 18* (not shown). By way of example and for brevity only, channel openings 25 are shown as being arranged in groups or columns of staggered rows of three and four channel openings 25 per row. Trenches 40 will typically be wider than channel openings 25 (e.g., 3 to 10 times wider). Any alternate existing or future-developed arrangement and construction may be used. One or more trenches 40 may be formed directly against TAV region 19 (not shown) including, for example, at least partially there-within (not shown). Alternately, a trench 40 that is closest to TAV region 19 may be laterally spaced therefrom (as shown).

TAV openings 84 have been formed into upper portion 18L of stack 18* in TAV region 19 and that individually extend to individual sacrificial plugs 80. TAV openings 84 may ultimately go to, through, or only into conductor tier 16. TAV openings 84 may taper laterally-inward or laterally-outward moving deeper into stack 18* (not shown). Regardless, TAV openings 84 may be of the same horizonal cross-sectional shape(s) as that of sacrificial plugs 80 (as shown), of different horizonal cross-sectional shape(s) therefrom (not shown), of the same horizontal size (as shown) there-as, and/or of different horizontal size therefrom (not shown). Regardless, individual TAV openings 84 may be horizontally offset relative to sacrificial plugs 80 (as shown; e.g., purposefully misaligned, unintentionally misaligned, and/or as an artifact of processing).

Trenches 40, channel openings 25, and TAV openings 84 (and/or material subsequently formed therein) may be formed in any order relative the other or at the same time or at one or more different times.

Figures 12, 13:
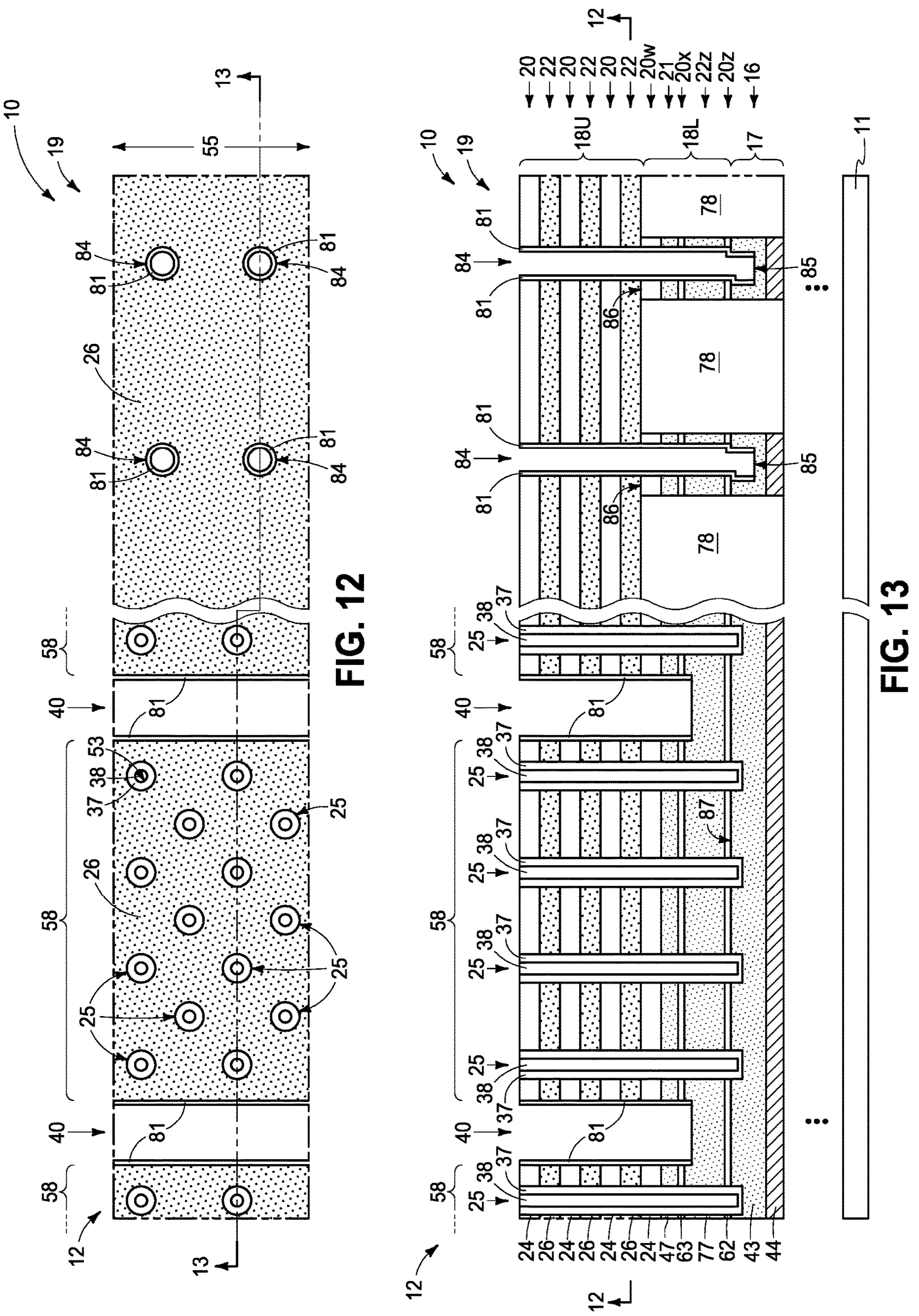

Referring to FIGS. 12 and 13, sacrificial plugs 80 (not shown) have been removed (e.g., by isotropic etching) through TAV openings 84 to extend such TAV openings 84 deeper into stack 18*. Thereafter, in one embodiment, a thin liner 81 (e.g., hafnium oxide, aluminum oxide, multiple layers of silicon dioxide and silicon nitride, etc.) has been formed, followed by punch-etching there-through to expose material therebelow.

Figures 14, 15:
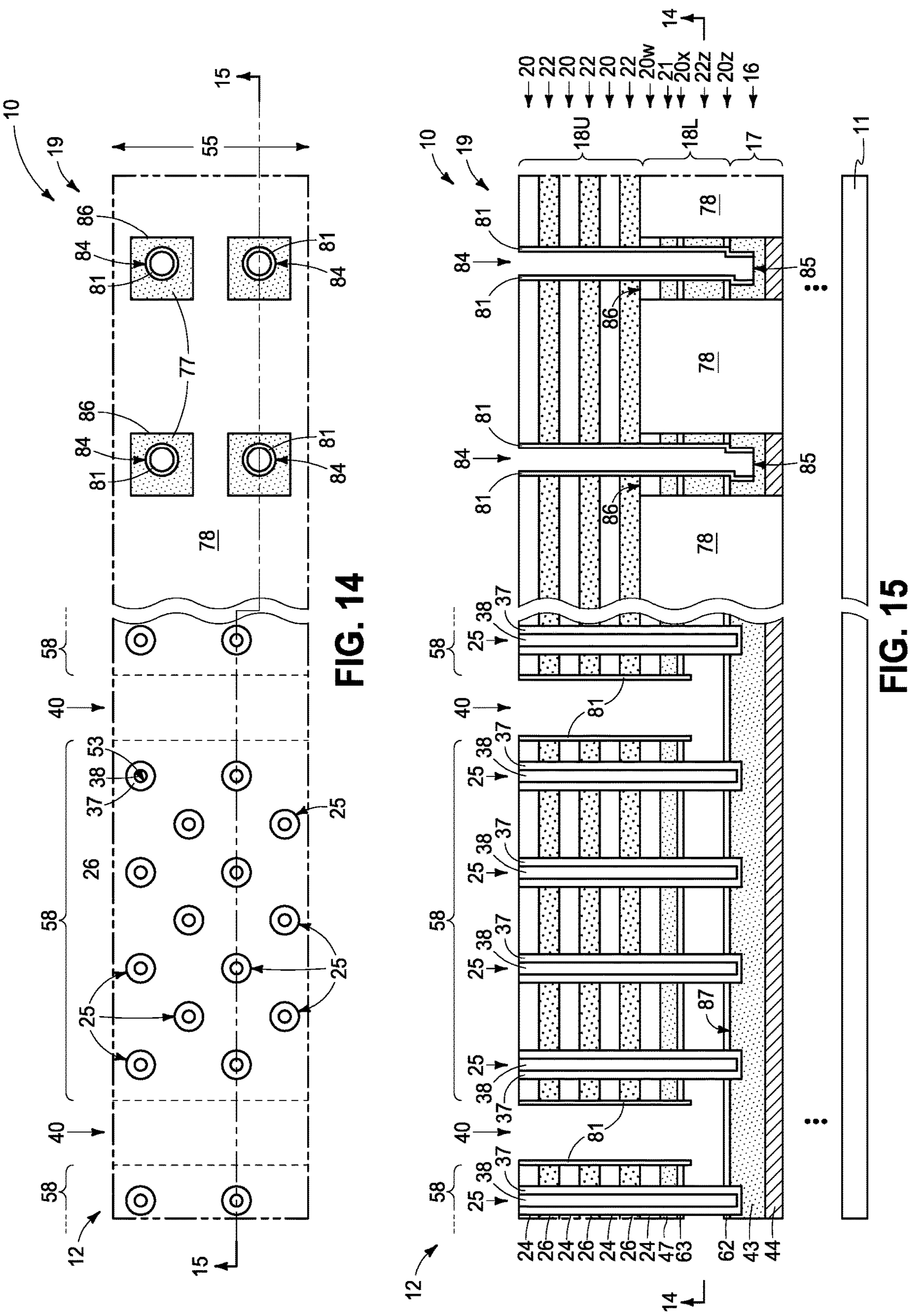

Referring to FIGS. 14 and 15, and in one embodiment, an etching fluid (not shown) has been flowed into horizontally-elongated trenches 40 (e.g., and into TAV openings 84) to isotropically etch sacrificial material 77 from lowest conductive tier 22*z* in array region 12 (sacrificial material 77 thereby not being shown in array region 12). Such etching is ideally conducted selectively relative to other exposed materials, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for other materials 77. Liner 81 is ideally resistant to the etching fluid used during the flowing. Depending on its composition, at least some of material 43 in conductor tier 16 in islands 86 may be etched by the etching fluid (not shown).

Figures 16, 17, 18:
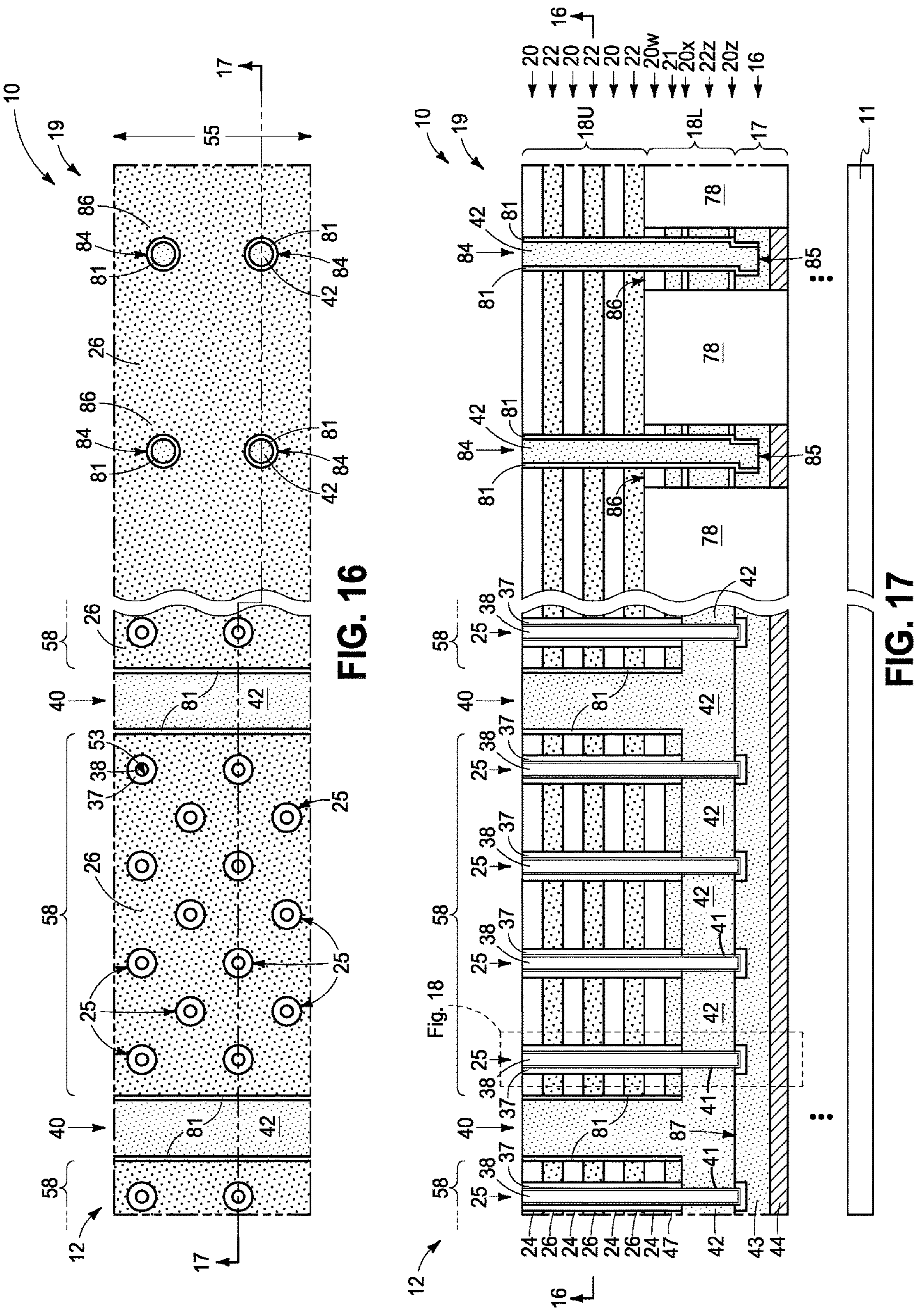
Figure 18:
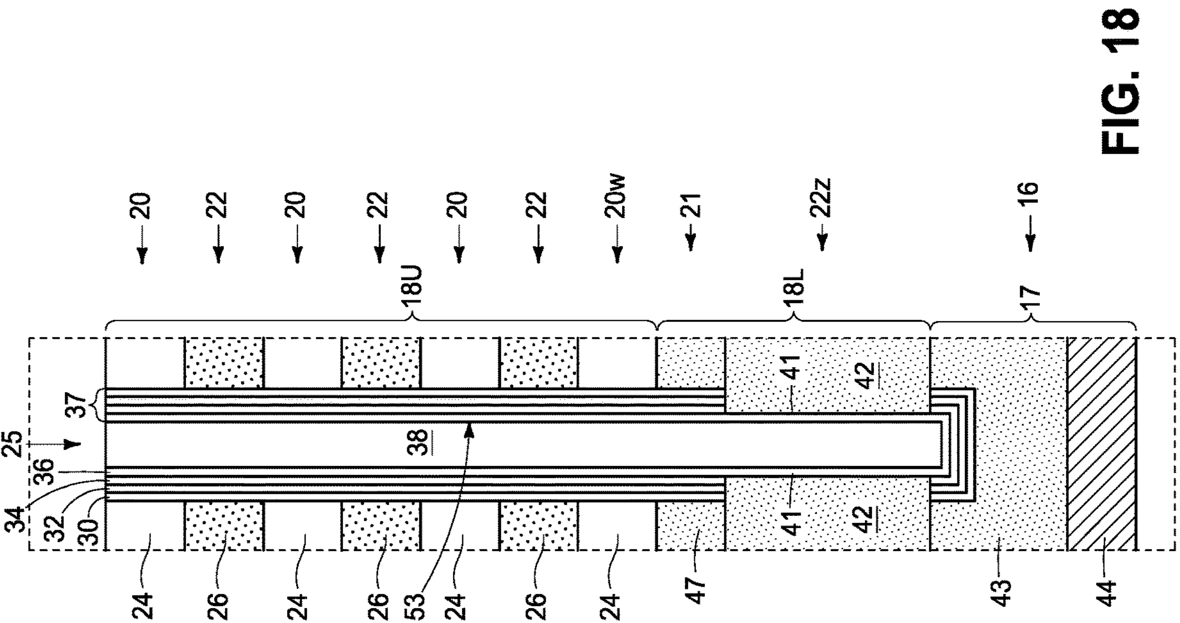

Referring to FIGS. 16-18, and in one embodiment, material 30 (e.g., silicon dioxide), material 32 (e.g., silicon nitride), and material 34 (e.g., silicon dioxide or a combination of silicon dioxide and silicon nitride) have been etched in tier 22*z* to expose a sidewall 41 of channel material 36 of channel-material strings 53 in lowest first tier 22*z*. Any of materials 30, 32, and 34 in tier 22*z* may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). In one embodiment, materials 62 and 63 (not shown in memory-block regions 58) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired.

After exposing sidewall 41, conductive material 42 (e.g., conductively-doped polysilicon) has been formed in lowest first tier 22*z* and in one embodiment directly against sidewall 41 of channel material 36. In one embodiment, conductive material 42 is formed to at least predominantly (i.e., more than 50% up to and including 100%) fill remaining volume of TAV openings 84 and remaining volume of trenches 40. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21. In one embodiment as shown, conducting material 47 of tier 21 and conductive material 42 of tier 22*z* being directly against one another may collectively be considered as the lowest conductive tier in array region 12.

Figures 19, 20:
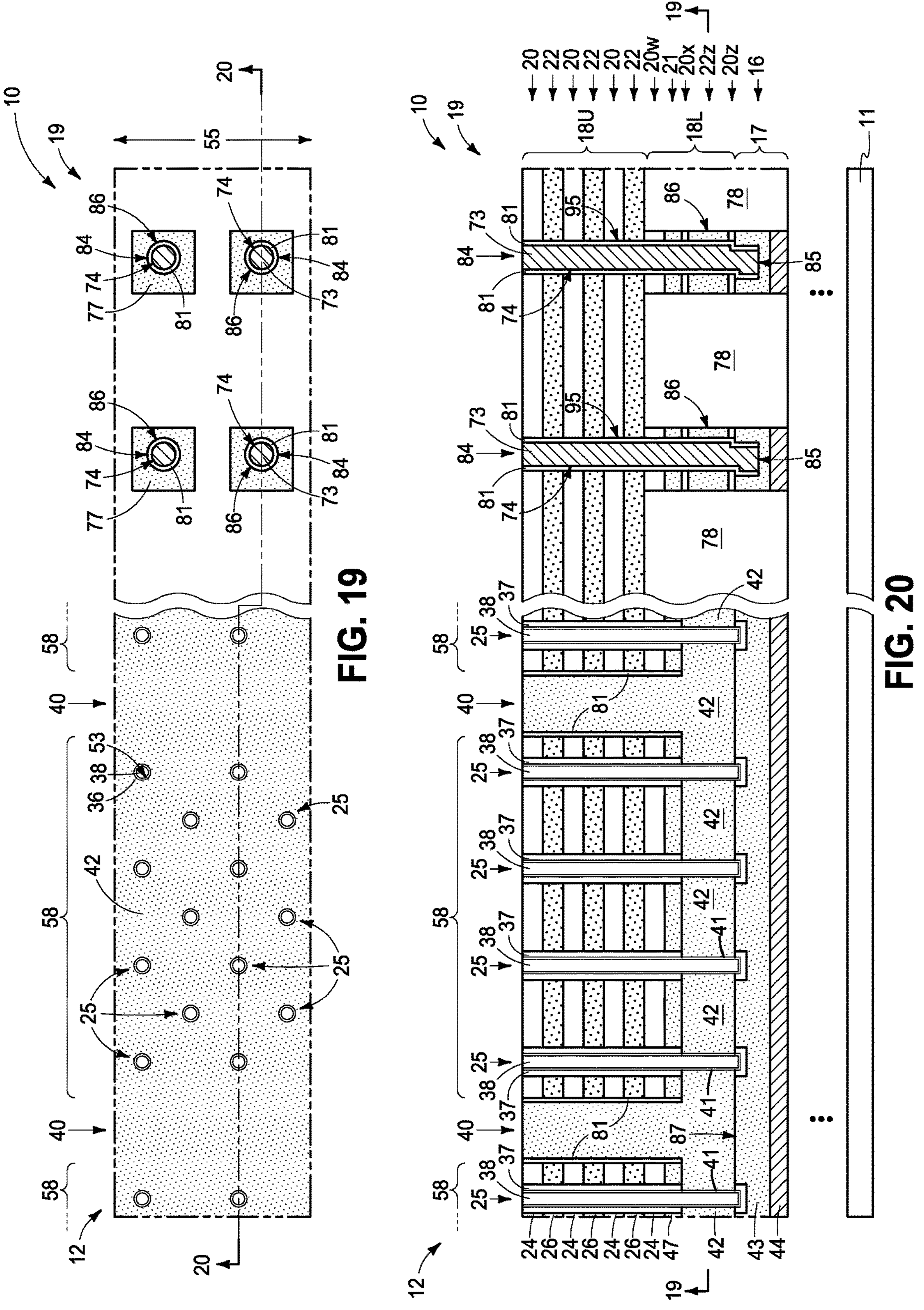

Referring to FIGS. 19 and 20, conductive material 42 has been removed from TAV openings 84 (not shown therein; e.g., if previously formed therein). Liner 81 may remain (e.g., if insulative; e.g., as shown). Alternately, it may be removed and another lining may be provided in TAV openings 84 (neither being shown). If so, material 26 in tiers 22 may be laterally recessed before forming another lining (not shown). Conductive material 42 in trenches 40 may be masked (masking material thereof not being shown) during processing associated with TAV openings 84. Regardless, conductive material 73 (e.g., a TiN lining having W radially-inward thereof) has been formed to form individual TAVs 74 (e.g., conductive material 73) of individual TAV constructions 95 (e.g., conductive material 73 in combination with insulative liner 81) in individual extended TAV openings 84 and in void-space therein resulting from removing sacrificial plugs 80 (such plugs not being shown in FIGS. 19 and 20).

Figures 21, 22:
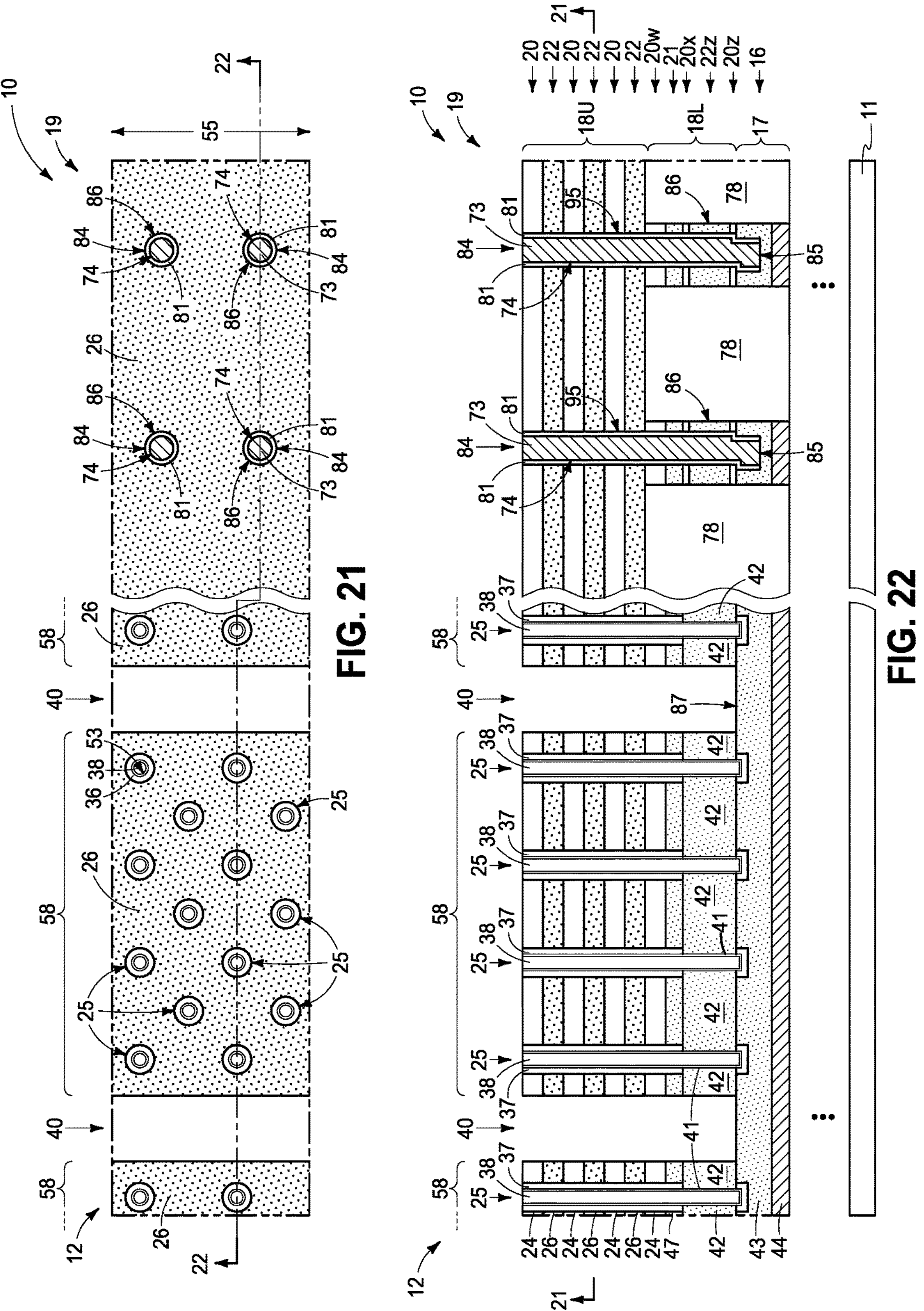

Referring to FIGS. 21 and 22, conductive material 42 has been removed from trenches 40 as has sacrificial liner 81 (not there-shown). Sacrificial liner 81 (when present) may be removed before or after forming conductive material 42.

Referring to FIGS. 23-29, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Some, all, or none of material 26 may be removed from TAV region 19 (no removal therefrom being shown) and replaced with conducting material 48, for example depending on proximity of trenches 40 that are closest thereto and/or presence or lack thereof of etch-blocking material(s)/structure(s) in tiers 22 in upper portion 18U (not shown).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/$cm^3$ to $1\times10^{12}$ atoms/$cm^3$ of atoms of conductivity-increasing impurity in said material. In this document, "doped" is a material having more than $1\times10^{12}$ atoms/$cm^3$ of atoms of conductivity-increasing impurity therein and "conductively-doped" is material having at least $1\times10^{18}$ atoms/$cm^3$ of atoms of conductivity-increasing impurity therein. Intervening material 57 may include through array vias (not shown).

Figures 23, 24:
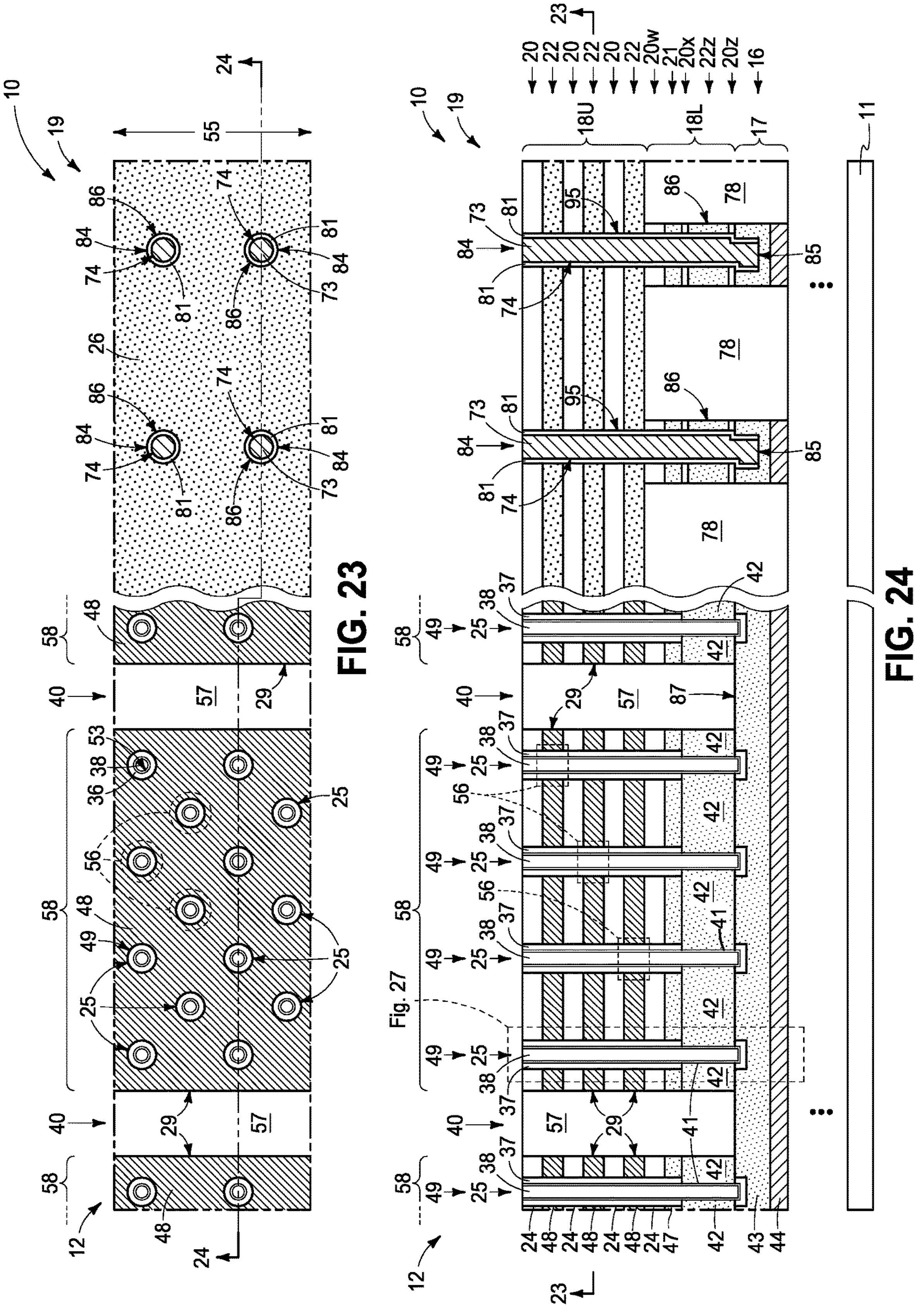
Figure 27:
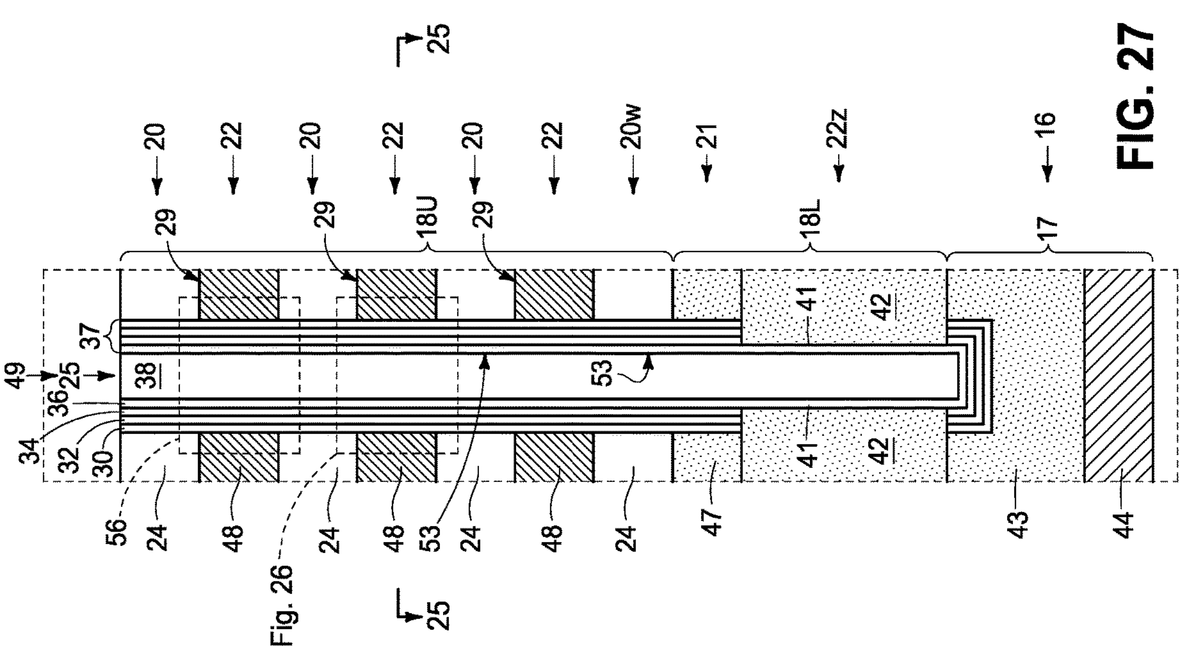
Figure 25:
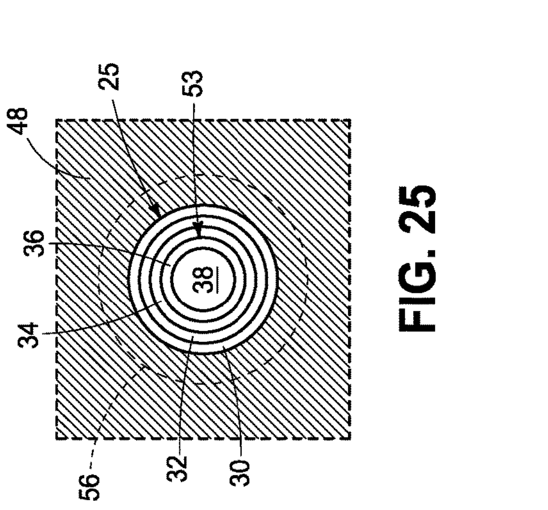
Figure 26:
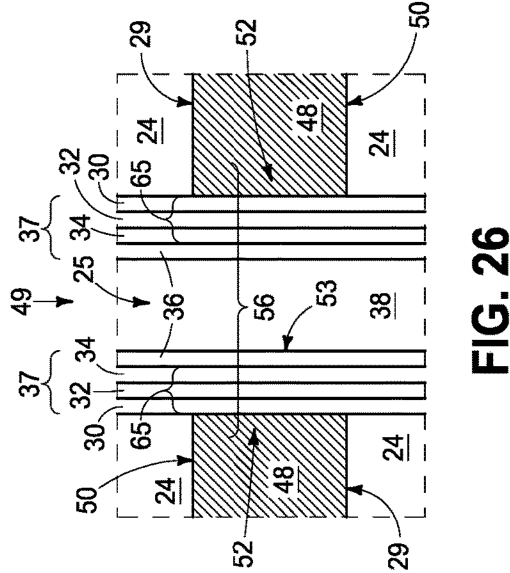
Figure 28:
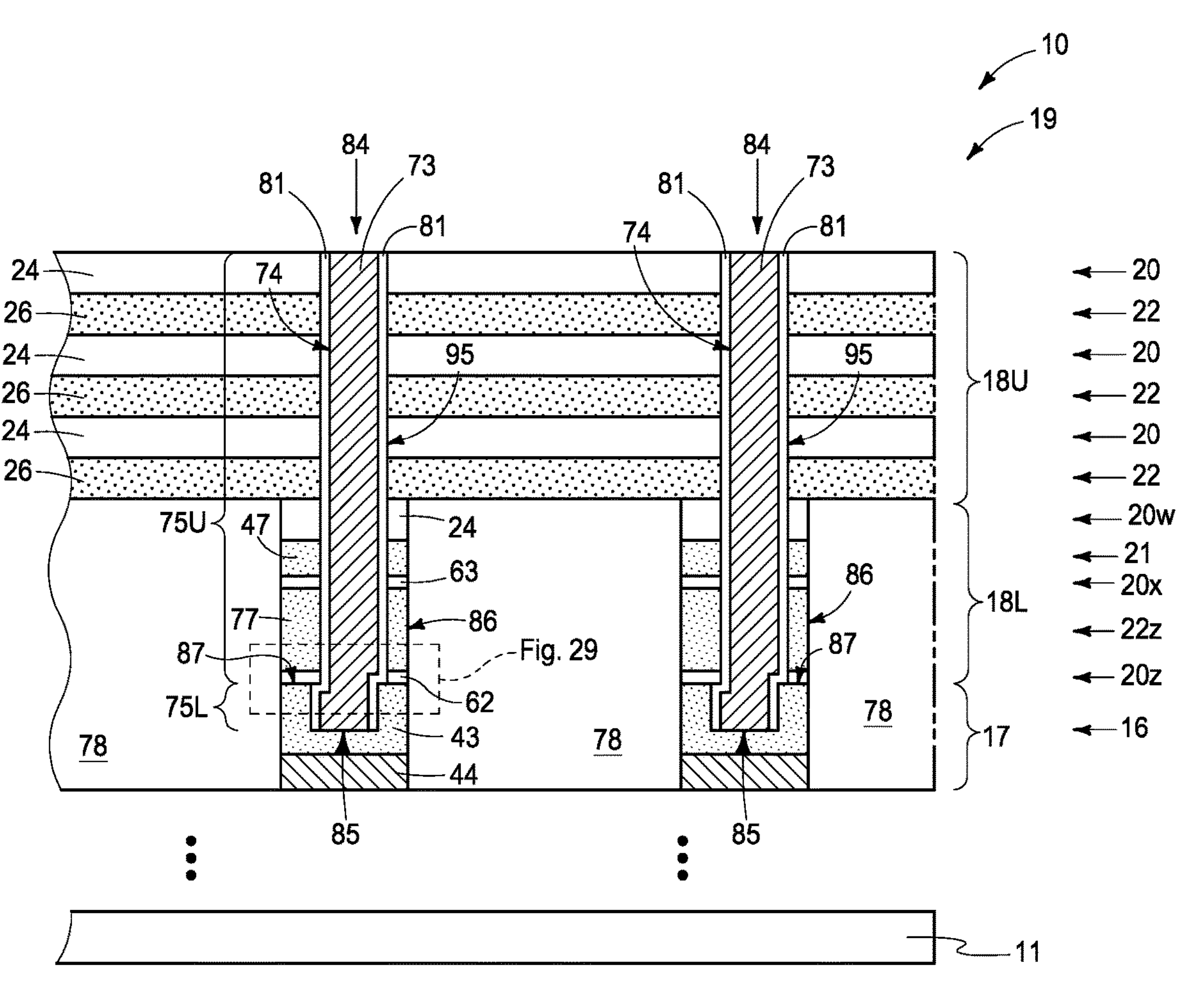
Figure 29:
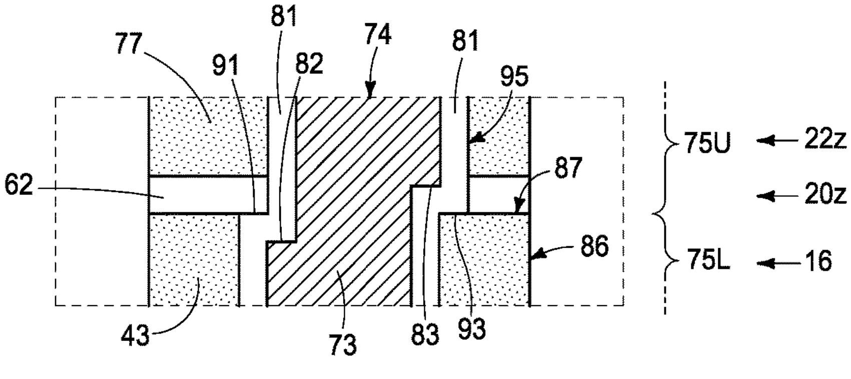
Figure 30:
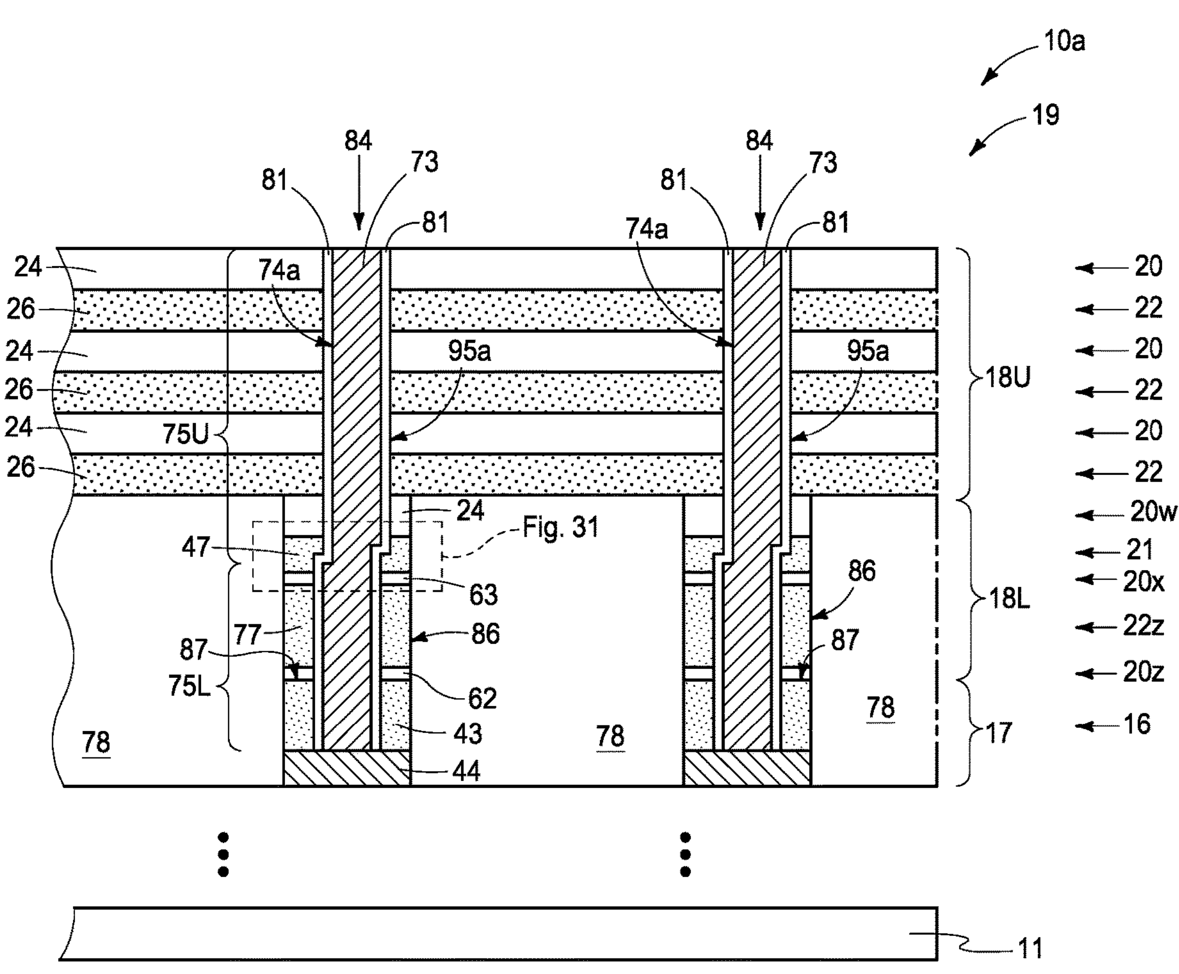
Figure 31:
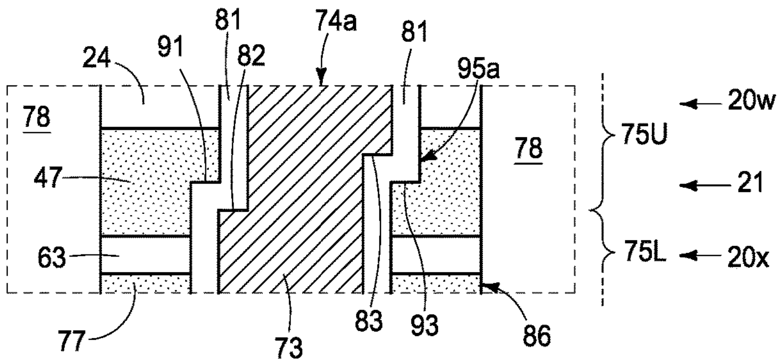
Figure 32:
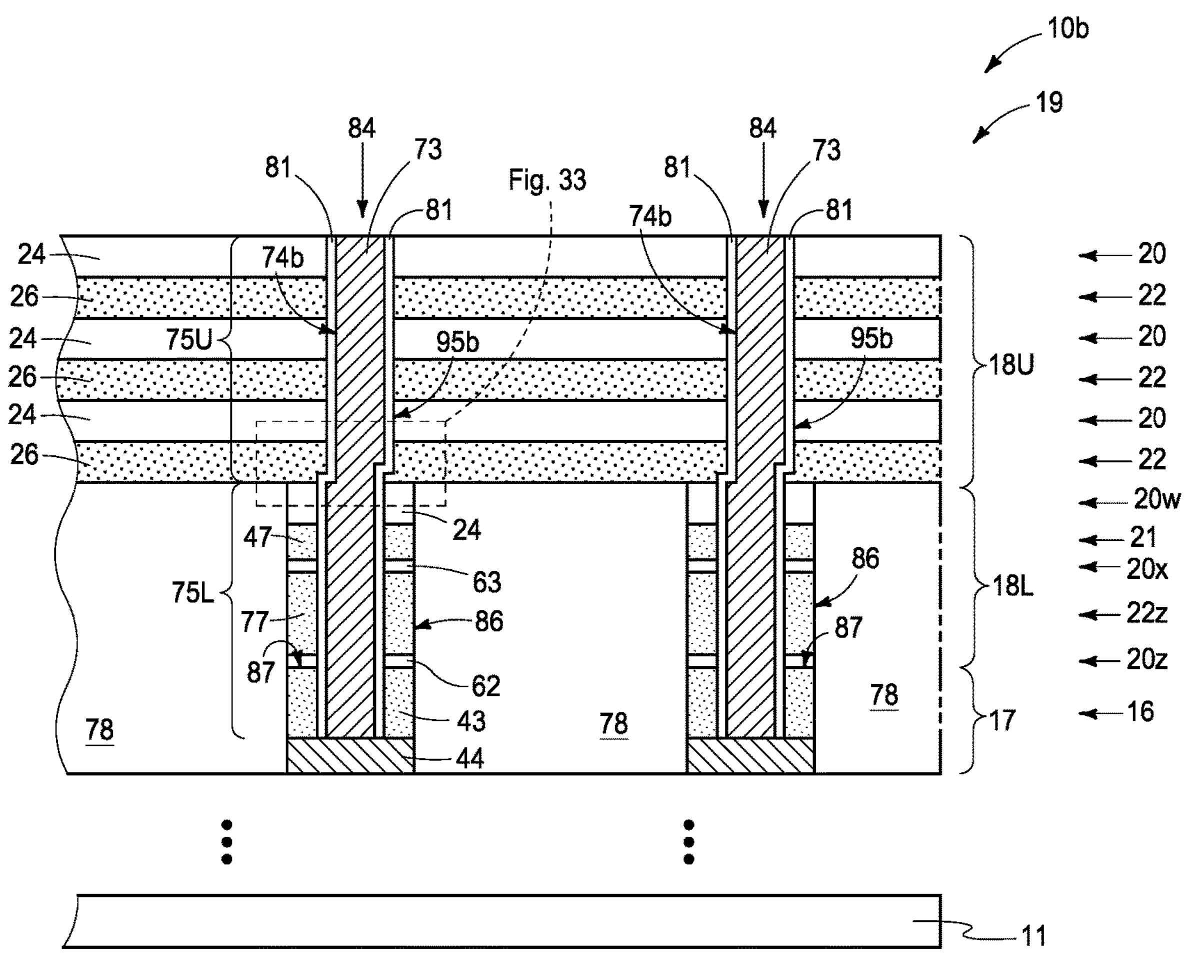
Figure 33:
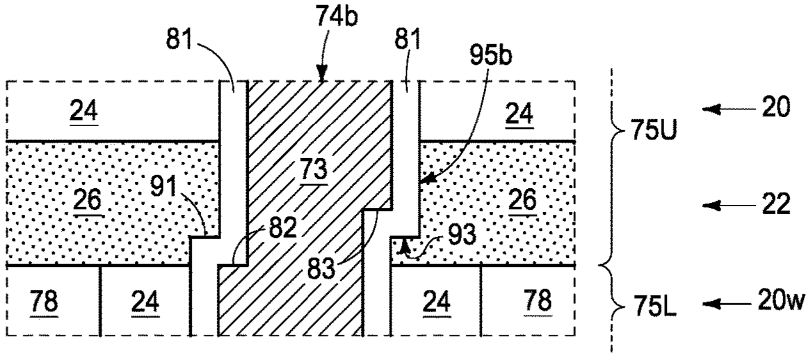

In one embodiment and as shown, individual TAVs 74 have been formed to comprise at least one external jog surface (e.g., two jog surfaces 82, 83 being shown) in a vertical cross-section (e.g., that of FIGS. 24, 28, and 29). In this document, a "jog surface" is characterized or defined by an abrupt change in direction [at least 15°] in comparison to surfaces that are immediately-above and immediately-below the jog surface. In one such embodiment and as shown, the external jog surface includes a part that is horizontal in the vertical cross-section (all of such being horizontal in the depicted example). In one embodiment where there are two external jog surfaces each of which includes a horizontal part, and as shown, the part of one of the two external jog surfaces is at a different elevation from the part of the other of the two external jog surfaces. In one embodiment where there are two external jog surfaces, such are at different elevations relative one another (regardless of whether comprising a part that is horizontal). In one embodiment, the external jog surface (e.g., 83) is above top 87 of conductor tier 16. In one embodiment, the external jog surface (e.g., 82) is below top 87 of and in conductor tier 16. The external jog surface may be at the top of the conductor tier (not shown).

Any other attribute(s) or aspect(s) as shown and/or described herein with respect to other embodiments may be used.

In one embodiment, a method used in forming a memory array (e.g., 12) comprising strings (e.g., 49) of memory cells (e.g., 56) comprises forming a lower portion (e.g., 18L) of a stack (e.g., 18*) that will comprise vertically-alternating first tiers (e.g., 22*) and second tiers (e.g., 20*) on a substrate (e.g., 11). The stack comprises laterally-spaced memory-block regions (e.g., 58) and a TAV region (e.g., 19). Sacrificial plugs (e.g., 80) are formed in the lower portion of the stack in the TAV region that are individually horizontally-located where individual TAVs (e.g., 74) will be formed (e.g., at locations 85). The vertically-alternating first tiers and second tiers of an upper portion (e.g., 18U) of the stack are formed directly above the lower portion of the stack and the sacrificial plugs. TAV openings (e.g., 84) are formed into the upper portion of the stack that individually extend to individual of the sacrificial plugs. The sacrificial plugs are removed through the TAV openings to extend the TAV openings deeper into the stack. An individual TAV (e.g., 74) is formed in individual of the extended TAV openings and in void-space therein resulting from said removing. Channel-material strings (e.g., 53) are formed that extend through the first tiers and the second tiers in the memory block regions. Any other attribute(s) or aspect(s) as shown and/or described herein with respect to other embodiments may be used. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A TAV region (e.g., 19) comprises TAV constructions (e.g., 95) that individually extend through the insulative tiers and the conductive tiers into the conductor tier. Individual of the TAV constructions comprise an upper portion (e.g., 75U) directly above and joined with a lower portion (e.g., 75L). The individual TAV constructions comprise at least one external jog surface (e.g., two jog surfaces 91, 93 being shown) in a vertical cross-section (e.g., that of FIGS. 24, 28 and 29) where the upper and lower portions join.

In one embodiment, the external jog surface (e.g., 91 and/or 93) is at the top (e.g., 87) of the conductor tier. In one embodiment, the external jog surface is above the top of the conductor tier and in one embodiment is below the top of and in the conductor tier (neither being shown in FIGS. 24, 28, and 29). In one embodiment, the channel-material strings are directly electrically coupled with the conductor material of the conductor tier by conducting material (e.g., 42) that is in a lowest of the conductive tiers (e.g., 22*z*) and that is directly against sidewalls (e.g., 41) of multiple of the channel-material strings.

Any other attribute(s) or aspect(s) as shown and/or described herein with respect to other embodiments may be used.

Manufacture of the example embodiments shown by FIGS. 23-29 used example sacrificial plugs 80 having their tops at top 87 of conductor tier 16 and having their bottoms in conductor tier 16 (e.g., such bottoms being in conductor material 43). However, by way of example, such tops could be in or at the top of lower portion 18L and/or such bottoms could be lower (e.g., in, at the top of, or at the bottom of conductor material 44). Example alternate such constructions are shown in FIGS. 30, 31 and 32, 33 with respect to constructions 10*a*, 10*b*, TAV constructions 95*a*, 95*b*, and TAVs 74*a*, 74*b*, respectively. Like numerals from the above-described embodiments have been used where appropriate, with some construction differences being indicated with the suffixes “a” or “b”, respectively. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, “elevational”, “higher”, “upper”, “lower”, “top”, “atop”, “bottom”, “above”, “below”, “under”, “beneath”, “up”, and “down” are generally with reference to the vertical direction. “Horizontal” refers to a general direction (i.e., within 10 degrees) along a primary substrate surface and may be relative to which the substrate is processed during fabrication, and vertical is a direction generally orthogonal thereto. Reference to “exactly horizontal” is the direction along the primary substrate surface (i.e., no degrees there-from) and may be relative to which the substrate is processed during fabrication. Further, “vertical” and “horizontal” as used herein are generally perpendicular directions relative one another and independent of orientation of the substrate in three-dimensional space. Additionally, “elevationally-extending” and “extend(ing) elevationally” refer to a direction that is angled away by at least 45° from exactly horizontal. Further, “extend(ing) elevationally”, “elevationally-extending”, “extend(ing) horizontally”, “horizontally-extending” and the like with respect to a field effect transistor are with reference to orientation of the transistor's channel length along which current flows in operation between the source/drain regions. For bipolar junction transistors, “extend(ing) elevationally” “elevationally-extending”, “extend(ing) horizontally”, “horizontally-extending” and the like, are with reference to orientation of the base length along which current flows in operation between the emitter and collector. In some embodiments, any component, feature, and/or region that extends elevationally extends vertically or within 10° of vertical.

Further, “directly above”, “directly below”, and “directly under” require at least some lateral overlap (i.e., horizontally) of two stated regions/materials/components relative one another. Also, use of “above” not preceded by “directly” only requires that some portion of the stated region/material/component that is above the other be elevationally outward of the other (i.e., independent of whether there is any lateral overlap of the two stated regions/materials/components). Analogously, use of “below” and “under” not preceded by “directly” only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array comprising strings of memory cells comprises forming a lower portion of a stack that will comprise vertically-alternating first tiers and second tiers on a substrate. The stack comprises laterally-spaced memory-block regions and a through-array-via (TAV) region. Sacrificial plugs are formed in the lower portion of the stack in the TAV region that are individually horizontally-located where individual TAVs will be formed. The vertically-alternating first tiers and second tiers of an upper portion of the stack are formed directly above the lower portion of the stack and the sacrificial plugs and TAV openings are formed into the upper portion of the stack that individually extend to individual of the sacrificial plugs. The sacrificial plugs are removed through the TAV openings to extend the TAV openings deeper into the stack. An individual TAV is formed in individual of the extended TAV openings and in void-space therein resulting from said removing. Channel-material strings are formed that extend through the first tiers and the second tiers in the memory block regions.

In some embodiments, a method used in forming a memory array comprising strings of memory cells comprises forming a conductor tier comprising conductor material on a substrate. A lower portion of a stack is formed that will comprise vertically-alternating first tiers and second tiers directly above the conductor tier. The stack comprises laterally-spaced memory-block regions and a through-array-via (TAV) region. Sacrificial plugs are formed in the conductor tier in the TAV region that are individually horizontally-located where individual TAVs will be formed. The vertically-alternating first tiers and second tiers of an upper portion of the stack are formed directly above the lower portion of the stack and the sacrificial plugs and TAV openings are formed into the upper portion of the stack that individually extend to individual of the sacrificial plugs. The sacrificial plugs are removed through the TAV openings to extend the TAV openings deeper into the stack. An individual TAV is formed in individual of the extended TAV openings and in void-space therein resulting from said removing. Channel-material strings are formed that extend through the first tiers and the second tiers in the memory block regions.

In some embodiments, a memory array comprising strings of memory cells comprise laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises TAV constructions that individually extend through the insulative tiers and the conductive tiers into the conductor tier. Individual of the TAV constructions comprise an upper portion directly above and joined with a lower portion. The individual TAV constructions comprise at least one external jog surface in a vertical cross-section where the upper and lower portions join.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:

forming a lower portion of a stack that will comprise vertically-alternating first tiers and second tiers on a substrate, the stack comprising laterally-spaced memory-block regions and a through-array-via (TAV) region;

forming sacrificial plugs in the lower portion of the stack in the TAV region that are individually horizontally-located where individual TAVs will be formed;

forming the vertically-alternating first tiers and second tiers of an upper portion of the stack directly above the lower portion of the stack and the sacrificial plugs and while a top surface of the stack is exposed forming TAV openings extending from the top surface into the upper portion of the stack that individually extend to individual of the sacrificial plugs;

removing the sacrificial plugs through the TAV openings to extend the TAV openings deeper into the stack;

after forming the extended TAV openings, forming an insulative liner extending from a conductor material of a conductor tier disposed below the lower portion of the stack to a top surface of the upper portion of the stack;

forming a conductive material within an individual of the extended TAV openings and in void-space therein resulting from said removing, the conductive material extending from the conductor material of the conductor tier to the top surface of the upper portion of the stack to form an individual TAV, the conductive material having two and only two external jog surfaces in a vertical cross-section and vertically between the top of the upper portion of the stack and a top of the conductor tier, the two external jog surfaces being on opposing lateral sides of the TAV in the vertical cross-section, the conductive material being laterally surrounded by the insulative liner that covers the jog surfaces, a bottom surface of the insulative liner and a bottom surface of the conductive material being in direct physical contact with the conductor material of the conductor tier; and forming channel-material strings that extend through the first tiers and the second tiers in the memory block regions, channel material of the channel-material strings being directly coupled with the conductor material of the conductor tier.

2. The method of claim 1 wherein the two external jog surfaces are at different elevations relative one another.

3. The method of claim 2 wherein the two external jog surfaces individually include a part that is horizontal in the vertical cross-section.

4. The method of claim 2 wherein the two external jog surfaces do not horizontally overlap one another in the vertical cross-section.

5. The method of claim 4 wherein the two external jog surfaces individually include a part that is horizontal in the vertical cross-section.

6. A method used in forming a memory array comprising strings of memory cells, comprising:

forming a conductor tier comprising conductor material on a substrate;

forming a lower portion of a stack that will comprise vertically-alternating first tiers and second tiers directly above the conductor tier, the stack comprising laterally-spaced memory-block regions and a through-array-via (TAV) region;

forming sacrificial plugs in the conductor tier in the TAV region that are individually horizontally-located where individual TAVs will be formed;

forming the vertically-alternating first tiers and second tiers of an upper portion of the stack directly above the lower portion of the stack and the sacrificial plugs and forming TAV openings extending from an upper surface of the upper portion into the upper portion of the stack, the TAV openings individually extending to individual of the sacrificial plugs;

removing the sacrificial plugs through the TAV openings to extend the TAV openings deeper into the stack;

forming an individual TAV in individual of the extended TAV openings and in void-space therein resulting from said removing, the individual TAV having an upper surface even with the upper surface of the upper portion of the stack and comprising conductive material having two and only two external jog surfaces in a vertical cross-section and vertically between the upper surface of the upper portion of the stack and a top of a conductor tier below the lower portion of the stack, the two external jog surfaces being on opposing lateral sides of the TAV in the vertical cross-section, the conductive material being laterally surrounded by an insulative liner within the individual TAV openings, the insulative liner being along the jog surfaces, a bottom surface of the insulative liner and a bottom surface of the conductive material being in direct physical contact with the conductor material of the conductor tier; and forming channel-material strings that extend through the first tiers and the second tiers in the memory block regions.

7. The method of claim 6 wherein the two external jog surfaces individually include a part that is horizontal in the vertical cross-section.

8. The method of claim 6 wherein the two external jog surfaces do not horizontally overlap one another in the vertical cross-section.

9. The method of claim 8 wherein the two external jog surfaces individually include a part that is horizontal in the vertical cross-section.

10. The method of claim 6 wherein the two external jog surfaces are at different elevations relative one another.

11. The method of claim 10 wherein the two external jog surfaces do not horizontally overlap one another in the vertical cross-section.

12. A method used in forming a memory array comprising strings of memory cells, comprising:

forming a conductor tier comprising conductor material on a substrate;

forming a lower portion of a stack that will comprise vertically-alternating first tiers and second tiers directly above the conductor tier, the stack being within a memory-block region comprising laterally-spaced memory blocks and a through-array-via (TAV) region;

forming sacrificial plugs in the conductor tier in the TAV region that are individually horizontally-located where individual TAVs will be formed;

forming the vertically-alternating first tiers and second tiers of an upper portion of the stack directly above the lower portion of the stack and the sacrificial plugs and forming TAV openings into the upper portion of the stack that individually extend to individual of the sacrificial plugs;

removing the sacrificial plugs through the TAV openings to extend the TAV openings deeper into the stack;

forming an individual TAV construction in individual of the extended TAV openings and in void-space therein resulting from said removing, the TAV construction comprising an insulative lining and conductive material radially inward thereof, the conductive material having two external jog surfaces in a vertical cross-section that are at different elevations relative one another, the insulative lining being along the two external jog surfaces of the conductive material and having two external jog surfaces in the vertical cross-section that are at the same elevation relative one another, a bottom surface of the insulative lining and a bottom surface of the conductive material being in direct physical contact with the conductor material of the conductor tier; and forming channel-material strings that extend through the first tiers and the second tiers in the memory block regions.

13. The method of claim 12 wherein each of the external jog surfaces individually include a part that is horizontal in the vertical cross-section.

14. The method of claim 12 wherein the conductive material has two and only two external jog surfaces in the vertical cross-section vertically between a top of the upper portion of the stack and a top of the conductor tier.

15. The method of claim 12 wherein the insulative lining has two and only two external jog surfaces in the vertical cross-section vertically between a top of the upper portion of the stack and a top of the conductor tier.

16. The method of claim 12 wherein, the conductive material has two and only two external jog surfaces in the vertical cross-section vertically between a top of the upper portion of the stack and a top of the conductor tier; and the insulative lining has two and only two external jog surfaces in the vertical cross-section vertically between the top of the upper portion of the stack and the top of the conductor tier.

* * * * *